United States Patent
Li et al.

(10) Patent No.: US 12,446,264 B2
(45) Date of Patent: Oct. 14, 2025

(54) COMPLEMENTARY FIELD EFFECT TRANSISTOR (CFET) WITH BALANCED N AND P DRIVE CURRENT

(71) Applicant: QUALCOMM Incorporated, San Diego, CA (US)

(72) Inventors: Xia Li, San Diego, CA (US); Junjing Bao, San Diego, CA (US); Giridhar Nallapati, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 436 days.

(21) Appl. No.: 18/068,992

(22) Filed: Dec. 20, 2022

(65) Prior Publication Data

US 2024/0204109 A1  Jun. 20, 2024

(51) Int. Cl.
*H10D 84/00* (2025.01)
*H10D 30/01* (2025.01)
*H10D 30/43* (2025.01)
*H10D 30/67* (2025.01)
*H10D 64/01* (2025.01)
(Continued)

(52) U.S. Cl.
CPC ....... *H10D 30/6757* (2025.01); *H10D 30/014* (2025.01); *H10D 30/43* (2025.01); *H10D 30/6729* (2025.01); *H10D 30/6735* (2025.01); *H10D 64/01* (2025.01); *H10D 84/0167* (2025.01); *H10D 84/0186* (2025.01); *H10D 84/038* (2025.01); *H10D 84/85* (2025.01);
(Continued)

(58) Field of Classification Search
CPC ....................... H10D 84/0165; H10D 84/0167
See application file for complete search history.

(56) References Cited

U.S. PATENT DOCUMENTS

2005/0007178 A1\* 1/2005 Fahim ................. H03K 17/063
                                                      327/390
2020/0098756 A1   3/2020 Lilak et al.
(Continued)

FOREIGN PATENT DOCUMENTS

| CN | 118315387 A | 7/2024 |
| EP | 4191653 A1 | 6/2023 |
| KR | 20200085897 A | 7/2020 |

OTHER PUBLICATIONS

International Search Report and Written Opinion—PCT/US2023/082740—ISA/EPO—Mar. 28, 2024.

*Primary Examiner* — Reema Patel
(74) *Attorney, Agent, or Firm* — Muncy, Geissier, Olds & Lowe, P.C.

(57) ABSTRACT

Disclosed are complementary field effect transistors (CFETs) with balanced n and p drive current, and methods for making the same. In an aspect, a CFET structure comprises an nFET with horizontal p-doped nanosheet channels arranged in a first vertical stack, each horizontal p-doped nanosheet channel having a width W1, and connecting a first source contact to a first drain contact through a first gate-all-around (GAA) region having a length L1. The CFET structure further comprises a pFET with horizontal n-doped nanosheet channels arranged in a second vertical stack disposed on the first vertical stack, each horizontal n-doped nanosheet channel having a width W2, and connecting a second source contact to a second drain contact through a second GAA region having a length L2, wherein W2/L2 is not equal to W1/L1.

18 Claims, 18 Drawing Sheets

(51) Int. Cl.
    *H10D 84/01*     (2025.01)
    *H10D 84/03*     (2025.01)
    *H10D 84/85*     (2025.01)
    *H10D 62/10*     (2025.01)

(52) U.S. Cl.
    CPC ......... *H10D 62/121* (2025.01); *H10D 64/017* (2025.01); *H10D 64/018* (2025.01)

(56) References Cited

U.S. PATENT DOCUMENTS

2022/0093593 A1   3/2022   Yang
2022/0109046 A1   4/2022   Hong et al.
2022/0336582 A1  10/2022   Jo et al.
2023/0067311 A1   3/2023   Lai et al.
2023/0343824 A1  10/2023   Yun et al.

\* cited by examiner

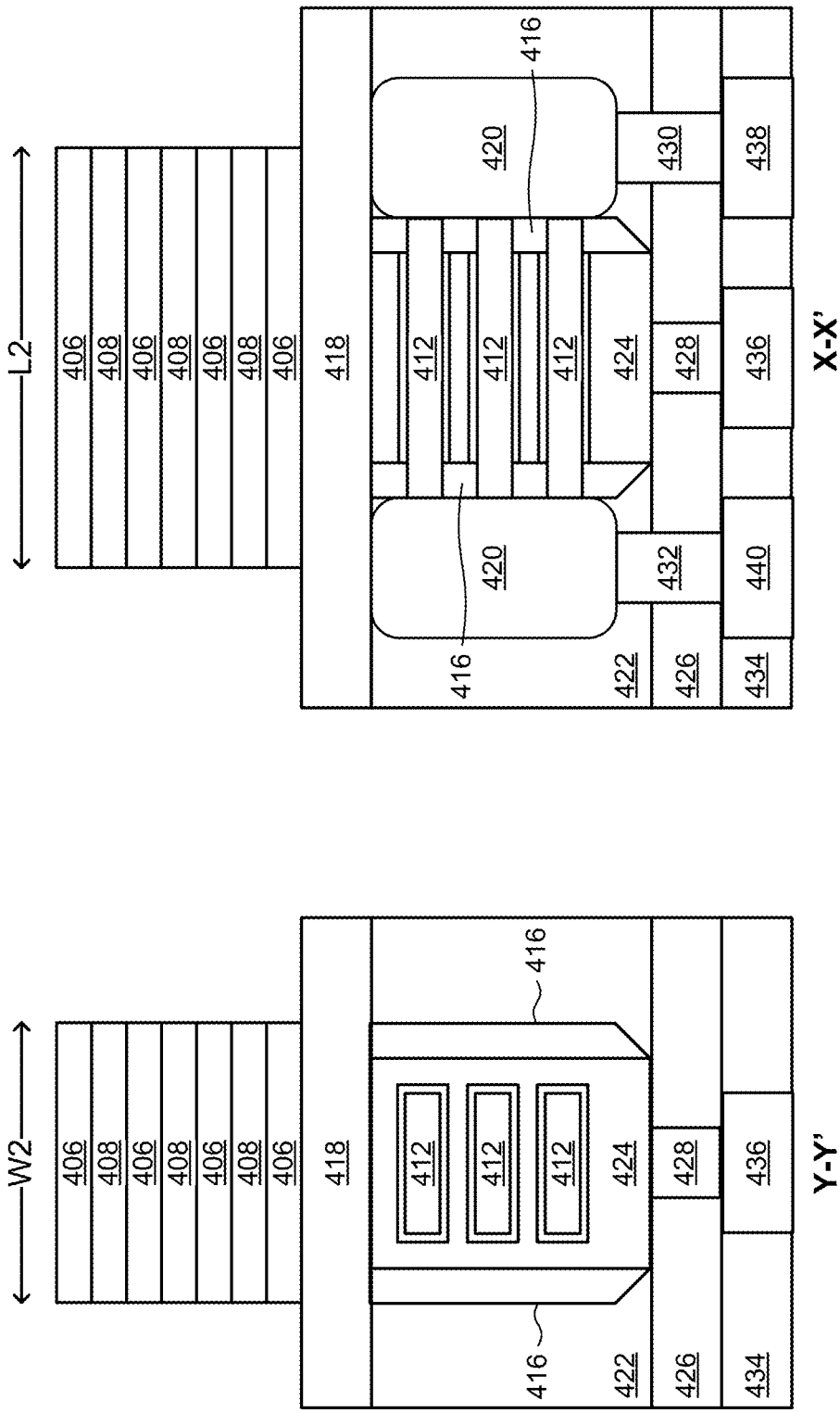

COMPLEMENTARY FIELD EFFECT TRANSISTOR (CFET) WITH BALANCED N AND P DRIVE CURRENT

BACKGROUND OF THE DISCLOSURE

1. Field of the Disclosure

Aspects of the disclosure relate generally to high performance devices, and more specifically to complementary field effect transistors (CFETs).

2. Description of the Related Art

Integrated circuit technology has achieved great strides in advancing computing power through miniaturization components such as semiconductor transistors. The progression of semiconductors have progressed from bulk substrates and planar CMOS, FinFETs, nanowires or nanoribbons (also called nanosheets), FinFET 3D stacking to nanowire or nanoribbon 3D stacking. The semiconductor technologies have largely been based on silicon. However, fabrication of transistors based on silicon may be problematic when it comes to further reduction in scaling, e.g., to few nanometers. Accordingly, there is a need for systems, apparatus, and methods that overcome the deficiencies of conventional devices including the methods, system and apparatus provided herein.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a complementary field effect transistor (CFET) structure includes an n-channel field effect transistor (nFET) having a plurality of horizontal p-doped nanosheet channels arranged in parallel in a first vertical stack and separated from each other by a first vertical distance D1, each horizontal p-doped nanosheet channel having a first width W1, and connecting a first source contact to a first drain contact through a first gate-all-around (GAA) region having a first length L1 and being connected to a first gate contact; and a p-channel field effect transistor (pFET) having a plurality of horizontal n-doped nanosheet channels arranged in parallel in a second vertical stack and separated from each other by a second vertical distance D2, each horizontal n-doped nanosheet channel having a second width W2, and connecting a second source contact to a second drain contact through a second GAA region having a second length L2 and being connected to a second gate contact, wherein the first vertical stack is disposed on the second vertical stack, and wherein W2/L2 is not equal to W1/L1. In some aspects, a ratio of (W2/L2) to (W1/L1) is chosen to cause a saturation current of the nFET to be approximately equal to a saturation current of the pFET.

In an aspect, a method of fabricating a CFET structure includes forming an nFET having a plurality of horizontal p-doped nanosheet channels arranged in parallel in a first vertical stack and separated from each other by a first vertical distance D1, each horizontal p-doped nanosheet channel having a first width W1, and connecting a first source contact to a first drain contact through a first GAA region having a first length L1 and being connected to a first gate contact. The method also includes forming a pFET having a plurality of horizontal n-doped nanosheet channels arranged in parallel in a second vertical stack and separated from each other by a second vertical distance D2, each horizontal n-doped nanosheet channel having a second width W2, and connecting a second source contact to a second drain contact through a second GAA region having a second length L2 and being connected to a second gate contact. The first vertical stack is disposed on the second vertical stack, and W2/L2 is not equal to W1/L1. In some aspects, a ratio of (W2/L2) to (W1/L1) is chosen to cause a saturation current of the nFET to be approximately equal to a saturation current of the pFET.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIGS. 5A through 5F illustrate steps of a process to fabricate a pFET portion of the CFET device, according to aspects of the disclosure.

DETAILED DESCRIPTION

Figure 1:
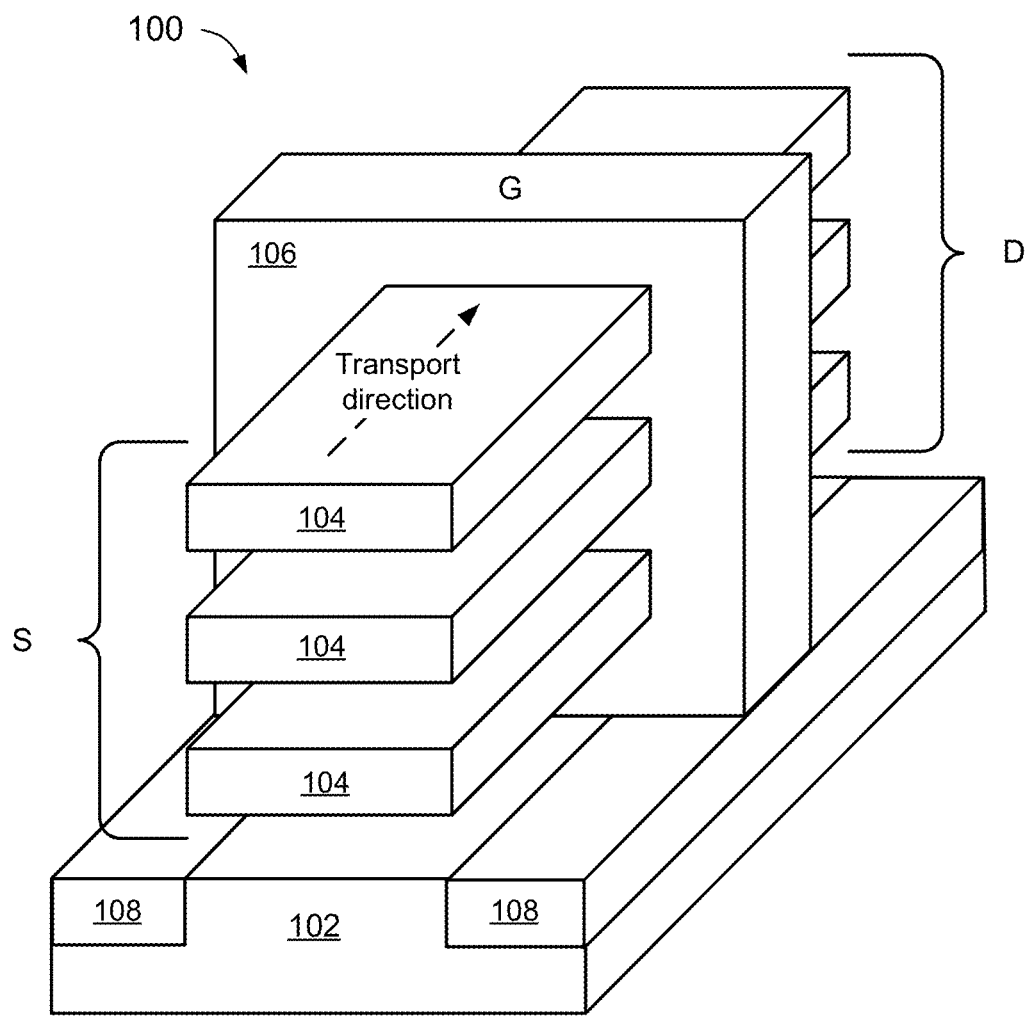
FIG. 1 illustrates a nanosheet field effect transistor (FET).

Disclosed are complementary field effect transistors (CFETs) with balanced n and p drive current, and methods for making the same. In an aspect, a CFET structure comprises an nFET with horizontal p-doped nanosheet channels arranged in a first vertical stack, each horizontal p-doped nanosheet channel having a width W1, and connecting a first source contact to a first drain contact through a first gate-all-around (GAA) region having a length L1. The CFET structure further comprises a pFET with horizontal n-doped nanosheet channels arranged in a second vertical stack disposed below the first vertical stack, each horizontal n-doped nanosheet channel having a width W2, and connecting a second source contact to a second drain contact through as second GAA region having a length L2. W2/L2 is not equal to W1/L1. In some aspects, the ratio of (W2/L2) to (W1/L1) is chosen to cause the saturation current of the nFET to be approximately equal to the saturation current of the pFET. For the discussion herein, the terms "drive current" and "saturation current" are treated as synonyms.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1 illustrates a nanosheet field effect transistor (FET) 100. The nanosheet FET 100 shown in FIG. 1 is built upon a silicon substrate 102 and comprises as set of three nanosheets 104 that extend through a gate-all-around gate (GAA) structure 106. One end of the three nanosheets 104 are electrically connected together to form the FET source (S), and the other end of the three nanosheets 104 are electrically connected together to form the FET drain (D). The gate structure is isolated from the substrate 102 by oxide channels 108.

Figure 2A:
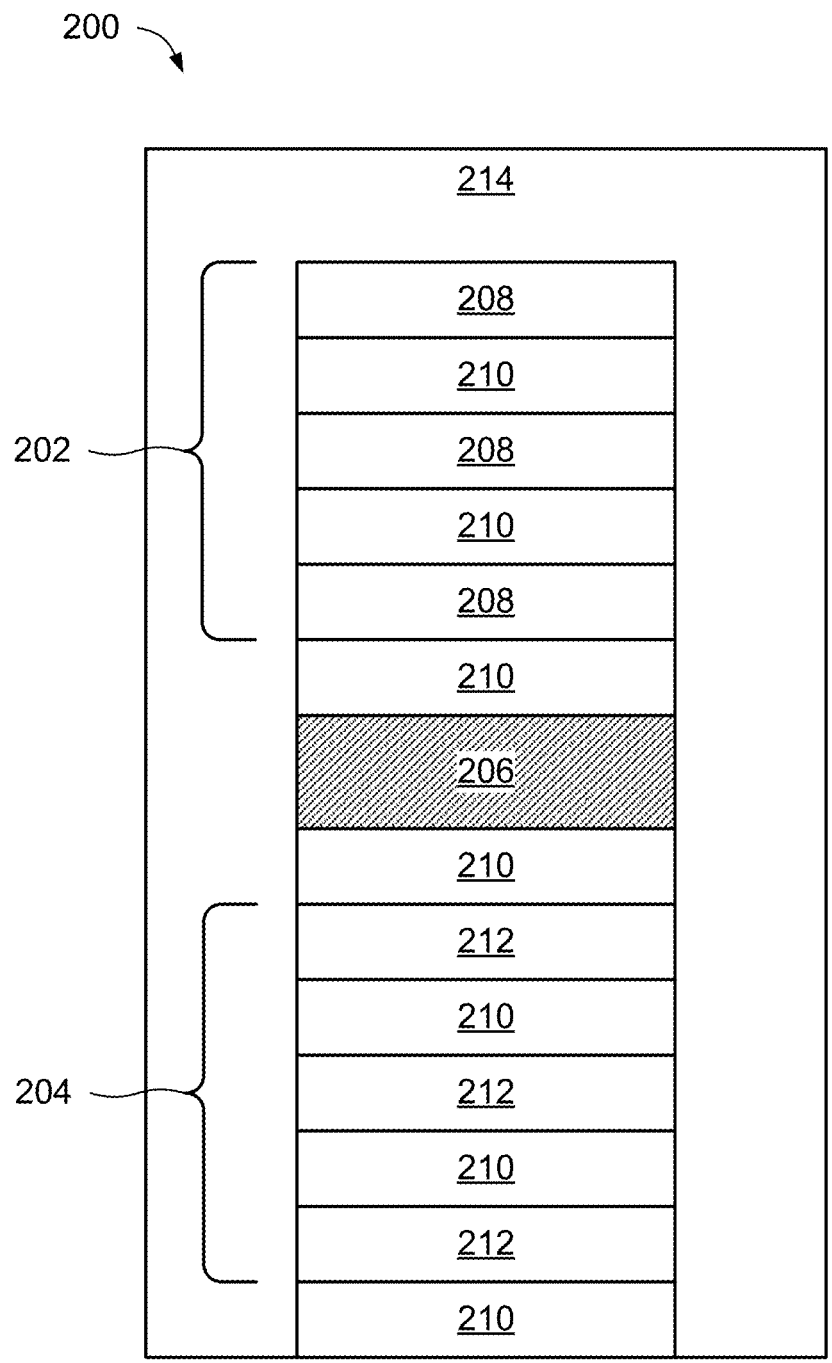
FIG. 2A is a cross-sectional view of a conventional monolithic complementary FET (CFET) comprising a pair of nanosheet FETs stacked vertically.

FIG. 2A is a cross-sectional view of a conventional monolithic complementary FET (CFET) 200 comprising a pair of nanosheet FETs stacked vertically. FIG. 2A illustrates a cross section though the gate structure, where the current goes into or out of the page, depending on the charge carrier. In the example shown in FIG. 2A, the CFET 200 includes a nanosheet p-channel FET structure (pFET) 202 and a nanosheet n-channel FET structure (nFET) 204 separated by an insulating layer 206. The pFET 202 comprises three n-doped nanosheets 208 separated by dummy layers 210. The nFET 204 comprises three p-doped nanosheets 212 separated by dummy layers 210. A gate structure 214 surrounds both the pFET 202 and the nFET 204.

Figure 2C:
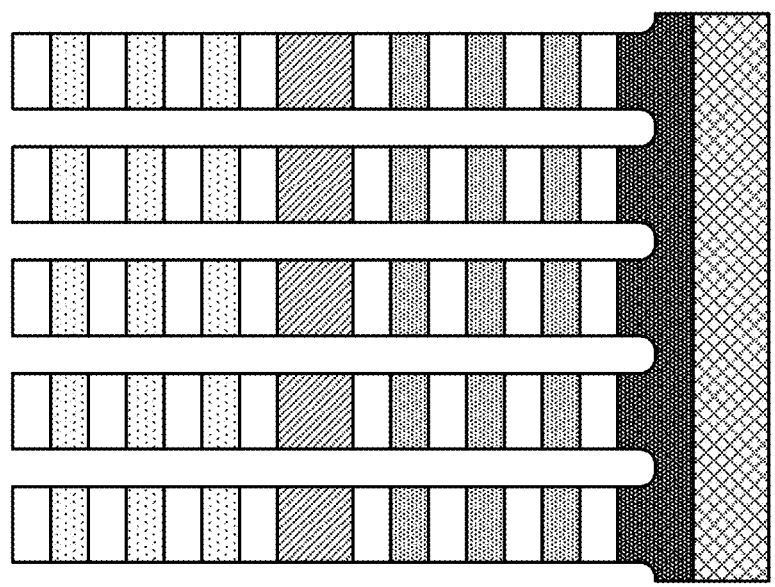
FIG. 2C is a cross sectional view of the wafer after vertical channels have been etched through the layers to leave columns of layers.
Figure 2B:
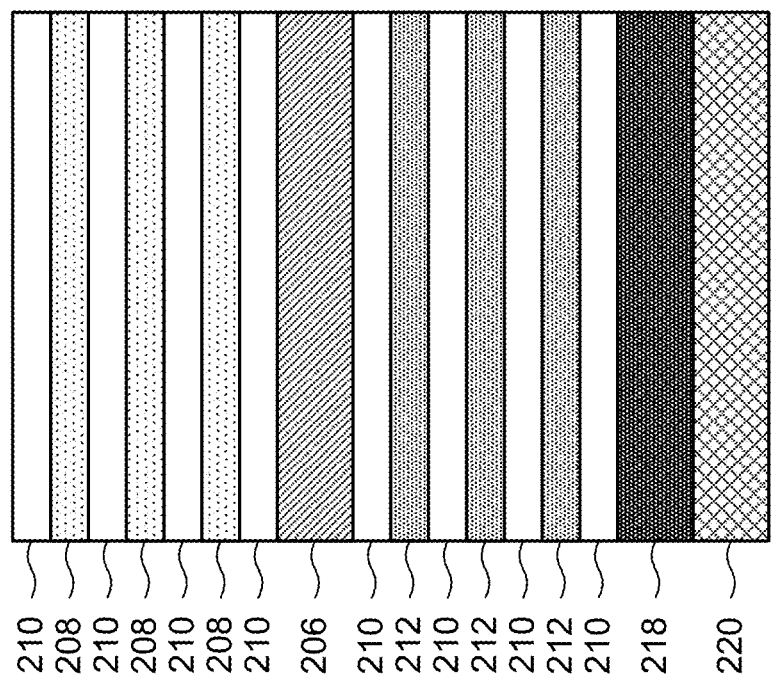
FIG. 2B is a cross-sectional view of an example wafer from which a CFET may be made.

FIG. 2B is a cross-sectional view of a wafer 216 from which the CFET 200 may be made. The wafer 216 includes the layers from which the insulating layer 206, the p-doped nanosheets 208, the dummy layers 210, and the n-doped nanosheets 212 will be made. In the example wafer 216 shown in FIG. 2B, the stack of layers 206, 208, 210, and 212 sit atop an oxide layer 218, which sits atop a substrate 220.

FIG. 2C is a cross sectional view of the wafer 216 after vertical aligned channels have been etched through the layers to leave columns of layers. A CFET 200 as shown in FIG. 2A may be constructed by surrounding one of these columns by a gate material 214.

Unlike a finFET, which has a vertically aligned channel, the nanosheet FET 100 and the CFET 200 have horizontally aligned channels stacked vertically on top of each other. Although the finFET and the nanosheet FETs have a transport direction of <110>. the finFet has a surface orientation of (110) but the nanosheet FETs have a surface orientation of (100) or (110) for the relatively large top surfaces and <110> for the relatively small side surfaces. As a result the electron mobility of the (100) nanosheet FETs is approximately 2.4 times greater than the electron mobility of the finFET, and the (100) hole mobility of the nanosheet FETs is approximately 0.33 smaller than the hole mobility of the finFET. For the CFET 200 particularly, this leads to an imbalance between the drive current of the pFET 202 and the drive current of the nFET 204. For example, in some processes, the drive current of an nFET 204 is approximately 4.4 times larger than the drive current of a pFET 202 of the same size. This drive current disparity tends to get worse with the CFETs bias temperature instability (BTI) age effect. Therefore, there is a need for CFETs with balanced N and P drive currents.

Accordingly, a CFET having balanced drive currents is herein presented, as well as methods for fabricating the same.

Figure 3A:
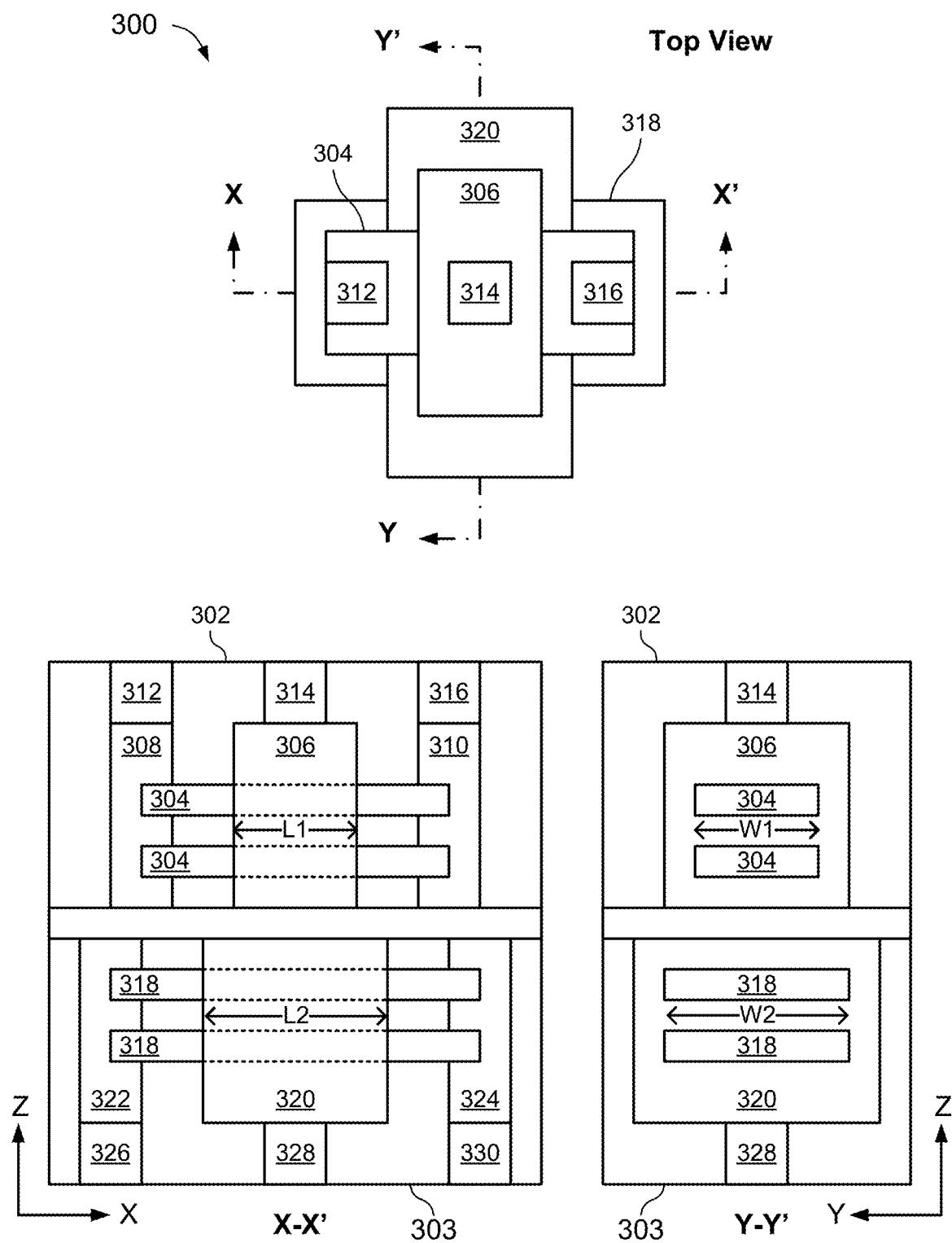
FIG. 3A illustrates several views of a CFET having balanced N and P drive currents, according to aspects of the disclosure.

FIG. 3A illustrates several views of a CFET 300 having balanced N and P drive currents, according to aspects of the disclosure. FIG. 3A includes a top view of the CFET 300, which has a nanosheet n-channel FET (nFET) 302 stacked on top of a nanosheet p-channel FET (pFET) 303. In the example shown in FIG. 3A, the nFET 302 comprises a pair of p-doped nanosheets 304 stacked vertically, a portion of which is surrounded by a gate 306. One end of the nanosheets 304 comprises a source 308 and the other end of the nanosheets 304 comprises a drain 310. The nFET 302 includes a source contact 312, a gate contact 314, and a drain contact 316. In the example shown in FIG. 3A, the pFET 303 comprises a pair of n-doped nanosheets 318 stacked vertically, a portion of which is surrounded by a second gate 320. One end of the n-doped nanosheets 318 comprises a second source 322 and the other end of the n-doped nanosheets 318 comprises a second drain 324. The pFET 303 includes a second source contact 326, a second gate contact 328, and a second drain contact 330.

As shown in FIG. 3A, the respective widths and lengths of the channels of the nFET 302 and the pFET 303 are chosen such that the drive current of the nFET 302 and the drive current of the pFET 303 are balanced. In the example shown in FIG. 3A, the nFET 302 has a channel having a first length L1 and a first width W1, and the pFET 303 has a channel having a second length L2 and a second width W2. For example, the drive current for a FET is proportional to the carrier mobility multiplied by the ratio of gate width over gate length. Thus, using the example above, in which the drive current of an nFET 302 is 4.4 times larger than the drive current of a pFET 303 of the same size, this disparity can be compensated by adjusting the gate width over gate length ratio of the pFET 303 so that it is 4.4 times larger than the gate width over gate length ratio of the nFET 302. Using the dimensions shown in FIG. 3A, for example, this means that W1, L1, W2, and L2 should be chosen such that W2/L2=4.4*(W1/L1), or an approximation thereof. It will be understood that, in other processes, feature sizes, and/or operating conditions, the ratio of nFET drive current to the pFET drive current for same-sized FETs may be values other than 4.4, in which case the ratio of (W2/L2) to (W1/L1) would be adjusted accordingly to compensate. For example, if the nFET saturation current of an nFET is 3.7 times larger than the saturation current of a similarly-sized pFET, then the sizes W1, L1, W2, and L2 should be chosen such that (W2/L2) should be 3.7 times larger than (W1/L1) so that the magnitude of the nFET drive current is approximately the same as the magnitude of the pFET drive current in CFET 300.

Figure 3B:
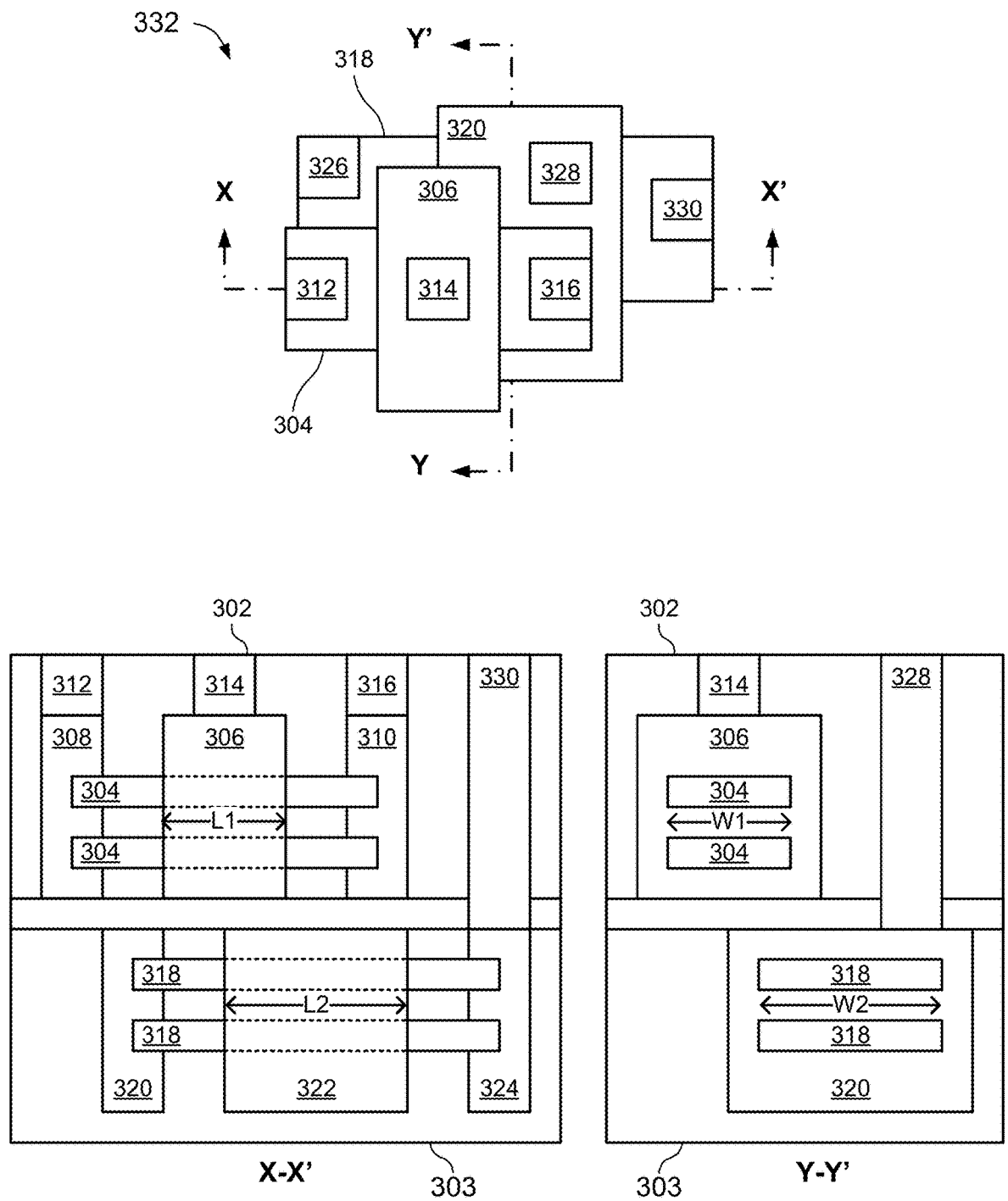
FIG. 3B illustrates several views of another CFET having balanced N and P drive currents, according to aspects of the disclosure.

FIG. 3B illustrates several views of another CFET 332 having balanced N and P drive currents, according to aspects of the disclosure. The elements in FIG. 3B are equivalent to their like-numbered elements in FIG. 3A, so their descriptions are not repeated here. However, while FIG. 3A shows a CFET 300 in which the nFET 302 is centered vertically over the pFET 303, FIG. 3B shows a layout variation in which the pFET 303 is offset in the X and/or Y direction relative to the nFET 302 so that the second source contact 326, the second gate contact 328, and/or the second drain contact 330 can be placed on the same side of the device as the source contact 312, gate contact 314, and drain contact 316.

FIGS. 4A through 4F illustrate steps of a process to fabricate an nFET portion of a CFET device, and FIGS. 5A through 5F illustrate steps of a process to fabricate a pFET portion of the CFET device, according to aspects of the disclosure. Each of FIGS. 4A-4F and 5A-5F show a pair of cross-sectional views: through the Y axis (left) and through the X axis (right).

Figure 4A:
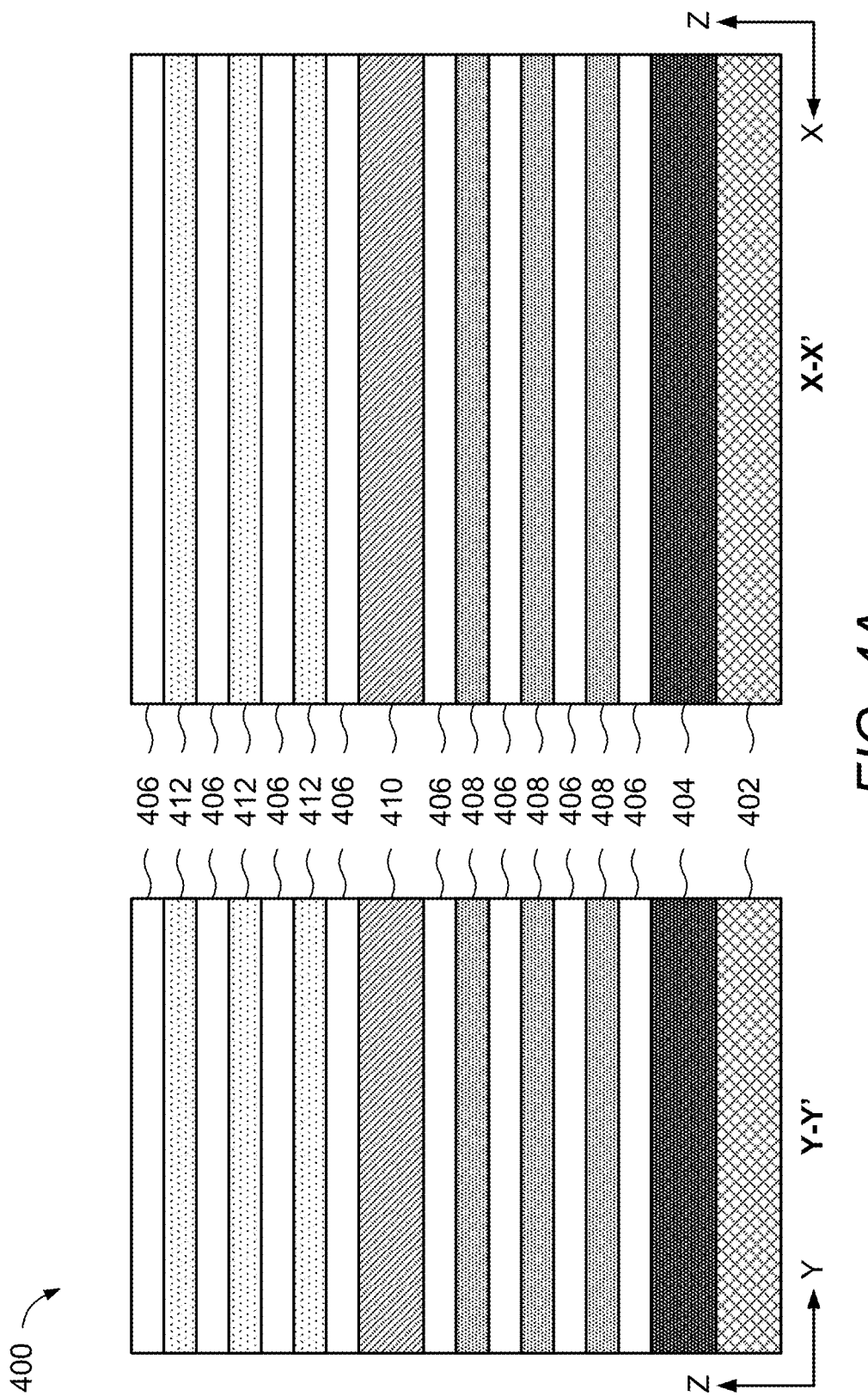
FIGS. 4A through 4F illustrate steps of a process to fabricate an nFET portion of a CFET device, according to aspects of the disclosure.

FIG. 4A shows the layers of a multi-layer epitaxial wafer 400 that includes a silicon substrate 402, an oxide layer 404, SiGe layers 406, p-doped layers 408 (e.g., Si, Ge, SiGe), a high-Ge-dose SiGe layer 410, and n-doped layers 412 (e.g., Si, Ge, SiGe).

Figure 4B:
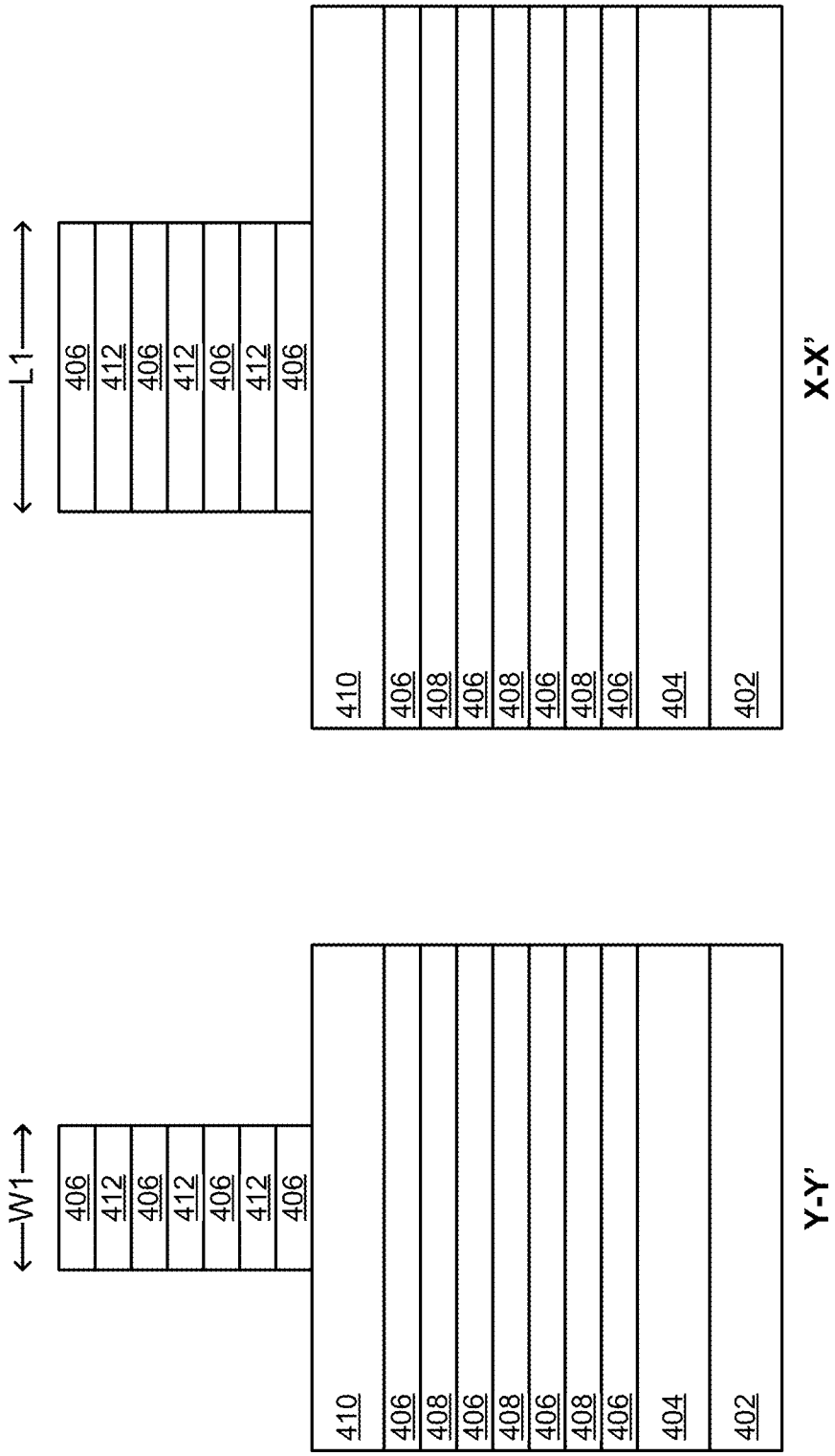

FIG. 4B shows the wafer 400 after top device slab patterning (e.g., photolithography, etching, etc.). This leaves a stack of alternating n-doped layers 412 and SiGe layers 406 having a first width W1 and a first length L1.

Figure 4C:
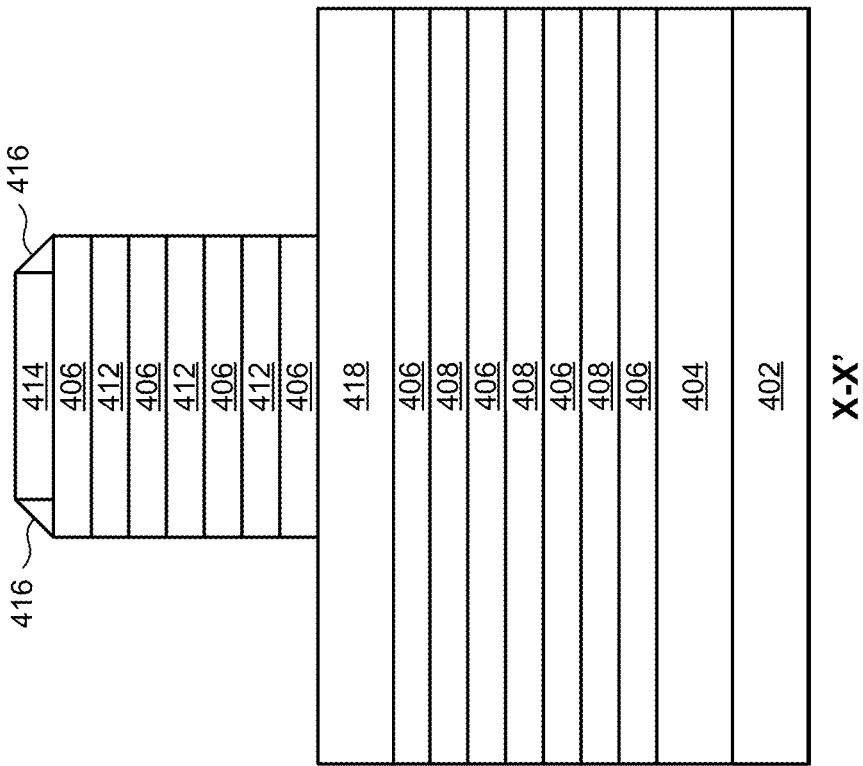
Figure 4C:
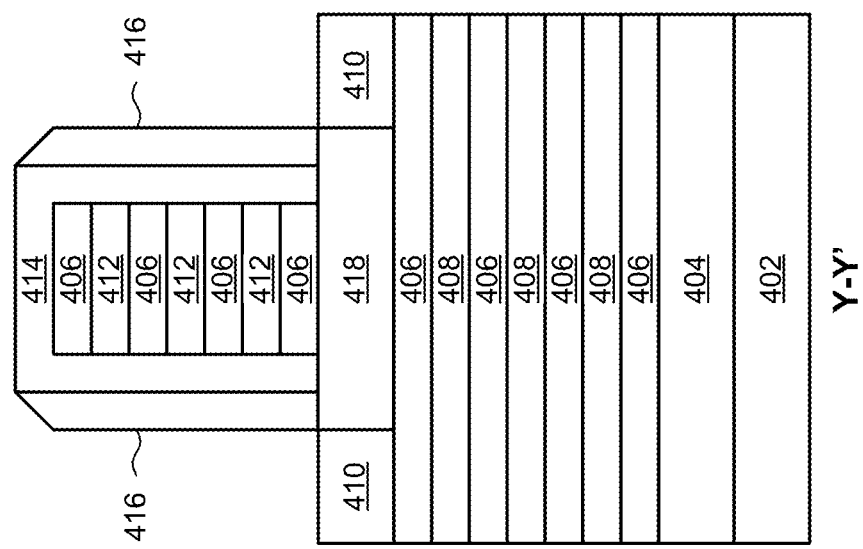

FIG. 4C shows the wafer 400 after depositing and patterning a dummy polysilicon ("poly") layer 414, depositing and patterning a SiN layer 416, and replacing a part of the high-Ge-dose SiGe layer 410 with an oxide 418.

Figure 4D:
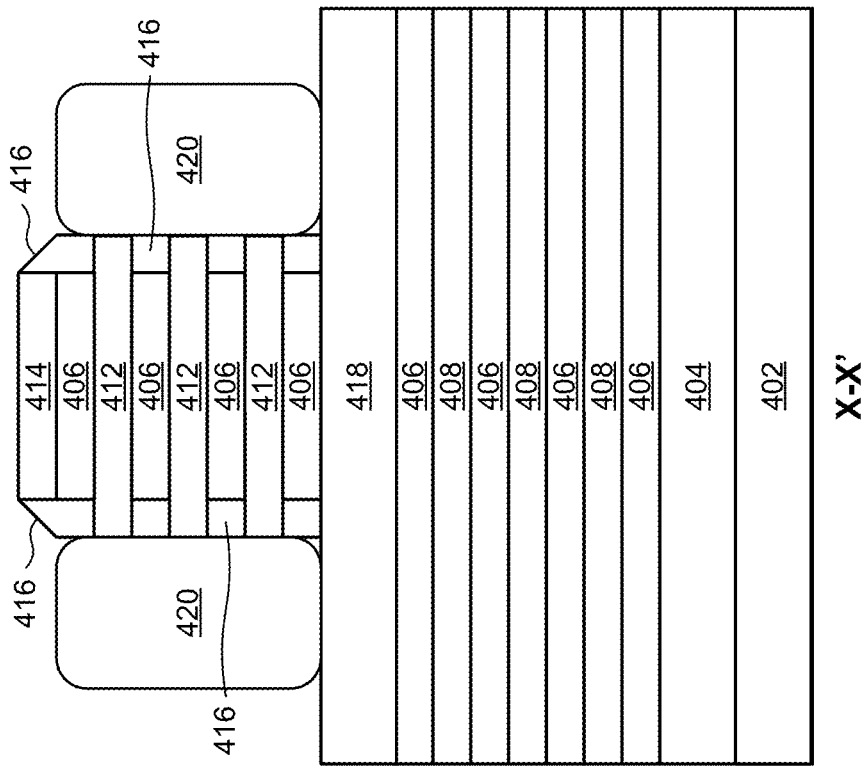
Figure 4D:
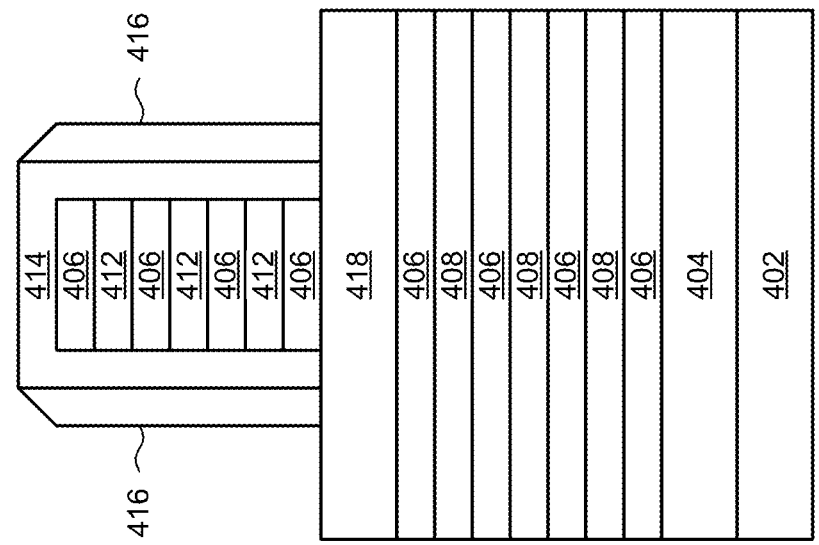

FIG. 4D shows the wafer 400 after replacing the rest of the high-Ge-dose SiGe layer 410 with oxide 418, recessing the SiGe layers 406, depositing SiN into the recesses, and etching back to form an inner spacer, and depositing source and drain epitaxial layers 420.

Figure 4E:
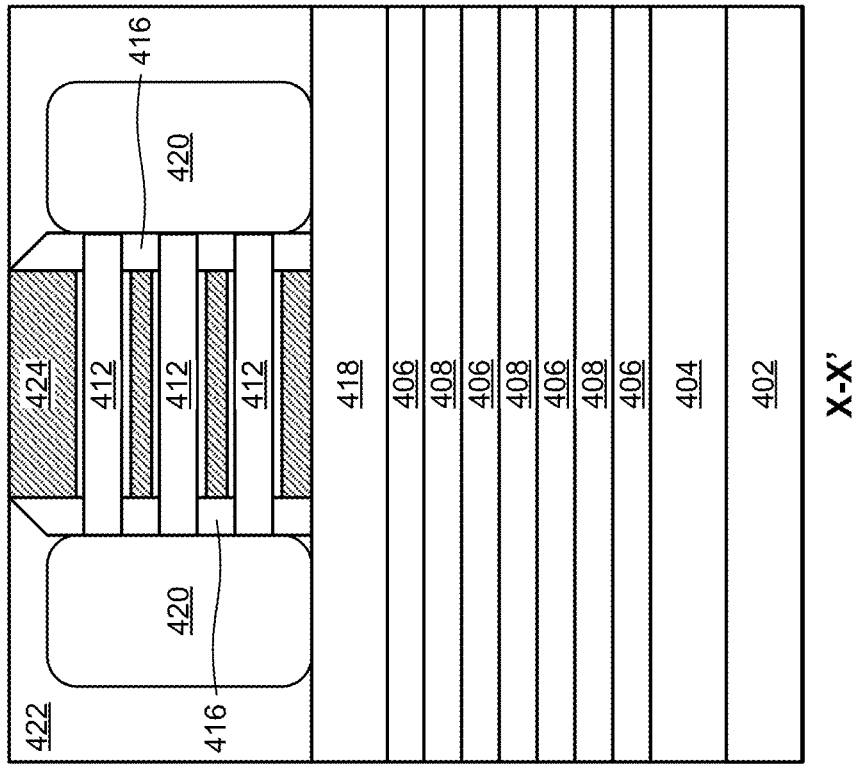
Figure 4E:
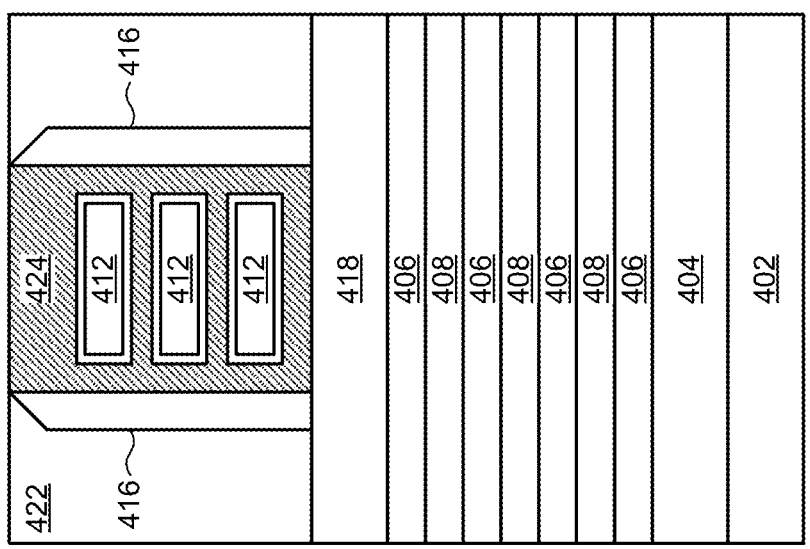

FIG. 4E shows the wafer 400 after depositing a field inter-layer-dielectric (F-ILD) oxide 422 and performing a chemical-mechanical polishing (CMP) step, then replacing the dummy poly layer 414 with a high-k and metal gate 424, and performing another CMP step.

Figure 4F:
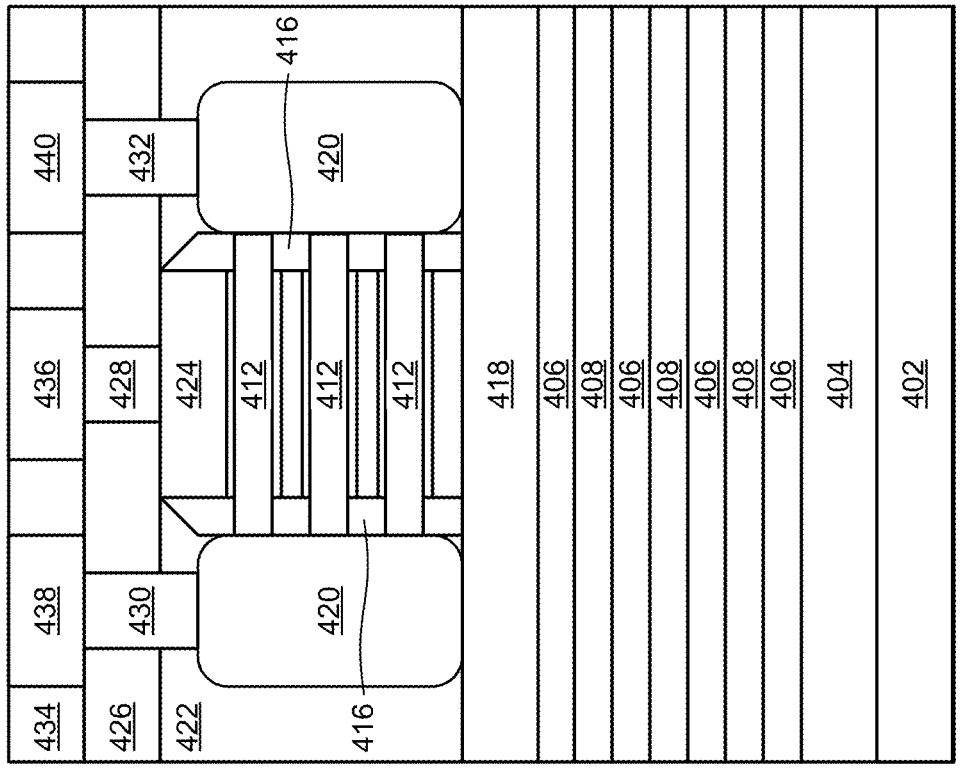
Figure 4F:
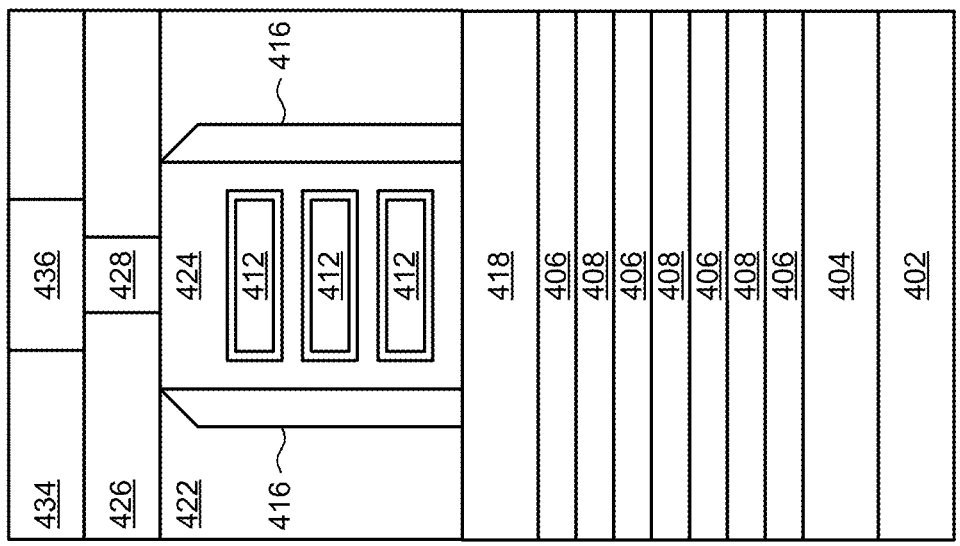

FIG. 4F shows the wafer 400 after depositing a second F-ILD oxide 426 and forming a gate contact 428, a source contact 430, and a drain contact 432, then depositing a field inter-metal-dielectric (F-IMD) oxide 434, and forming first metal layer structures such as the gate metal contact 436, the source metal contact 438, and the drain metal contact 440.

Figure 5A:
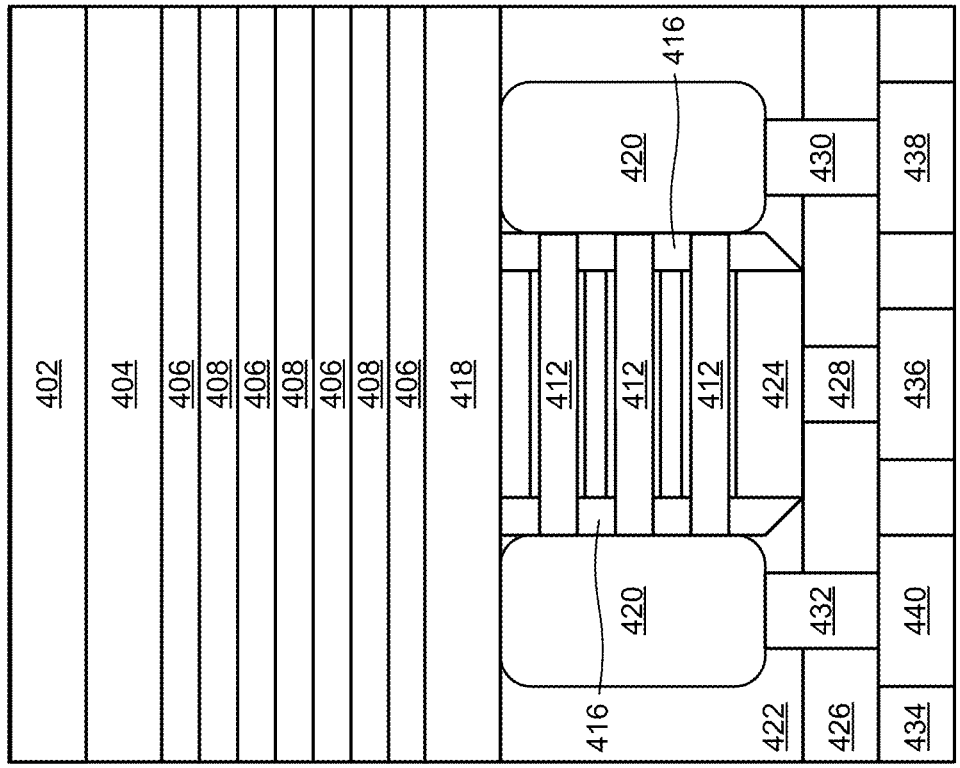
Figure 5A:
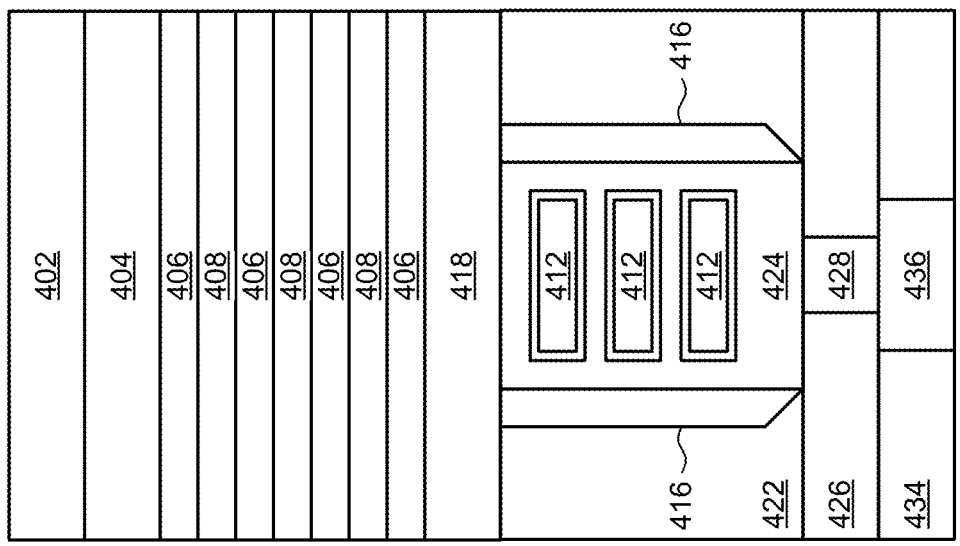

FIG. 5A shows the wafer 400 after it has been flipped and mounted to a carrier wafer (not shown).

FIG. 5B shows the wafer 400 after removing the silicon substrate 402 and the oxide layer 404, and performing bottom device slab patterning. This leaves a stack of alternating p-doped layers 408 and SiGe layers 406 having a second width W2 and a second length L2.

Figure 5C:
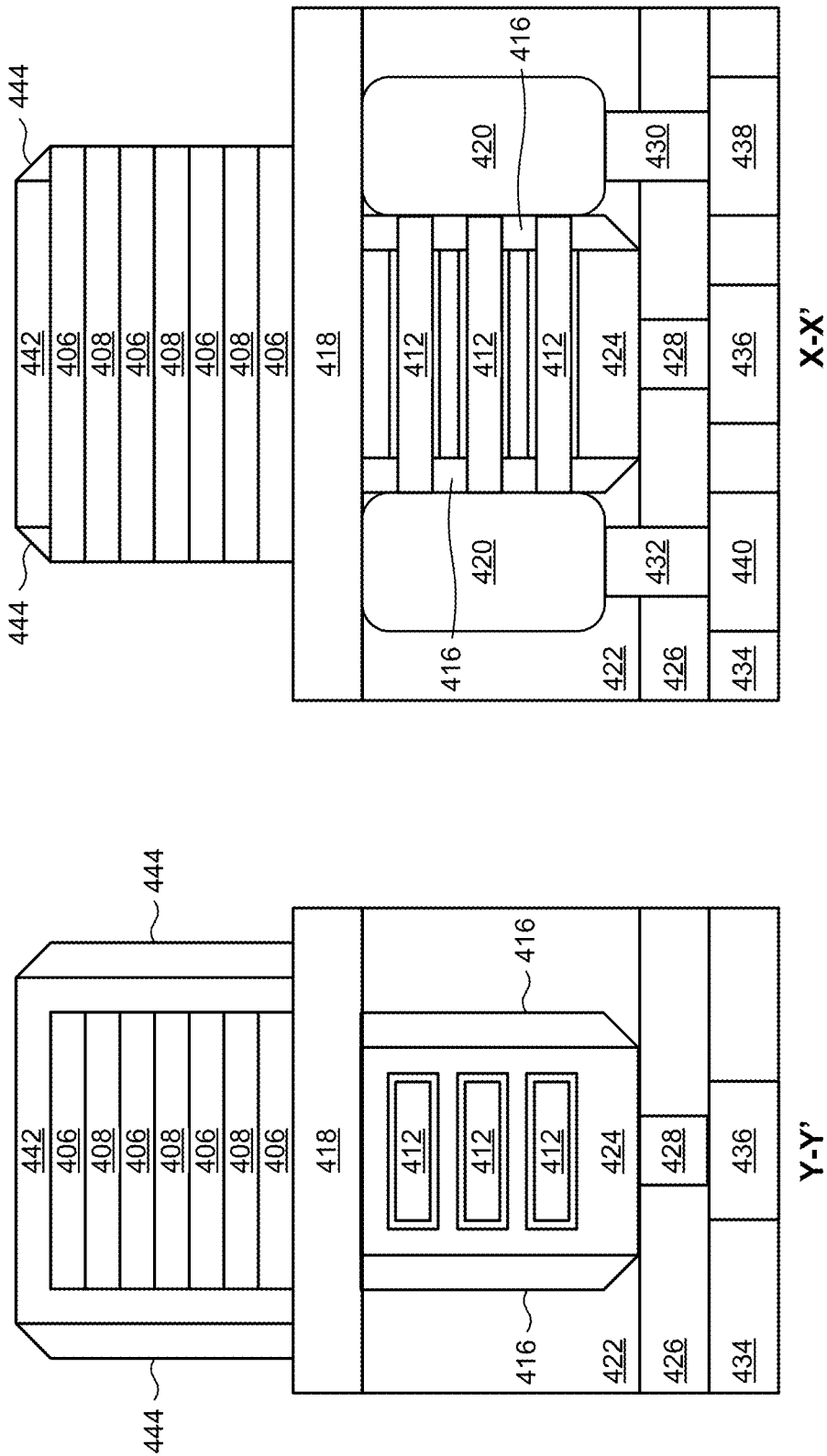

FIG. 5C shows the wafer 400 after depositing and patterning a second dummy poly layer 442, and depositing and patterning a second SiN layer 444.

Figure 5D:
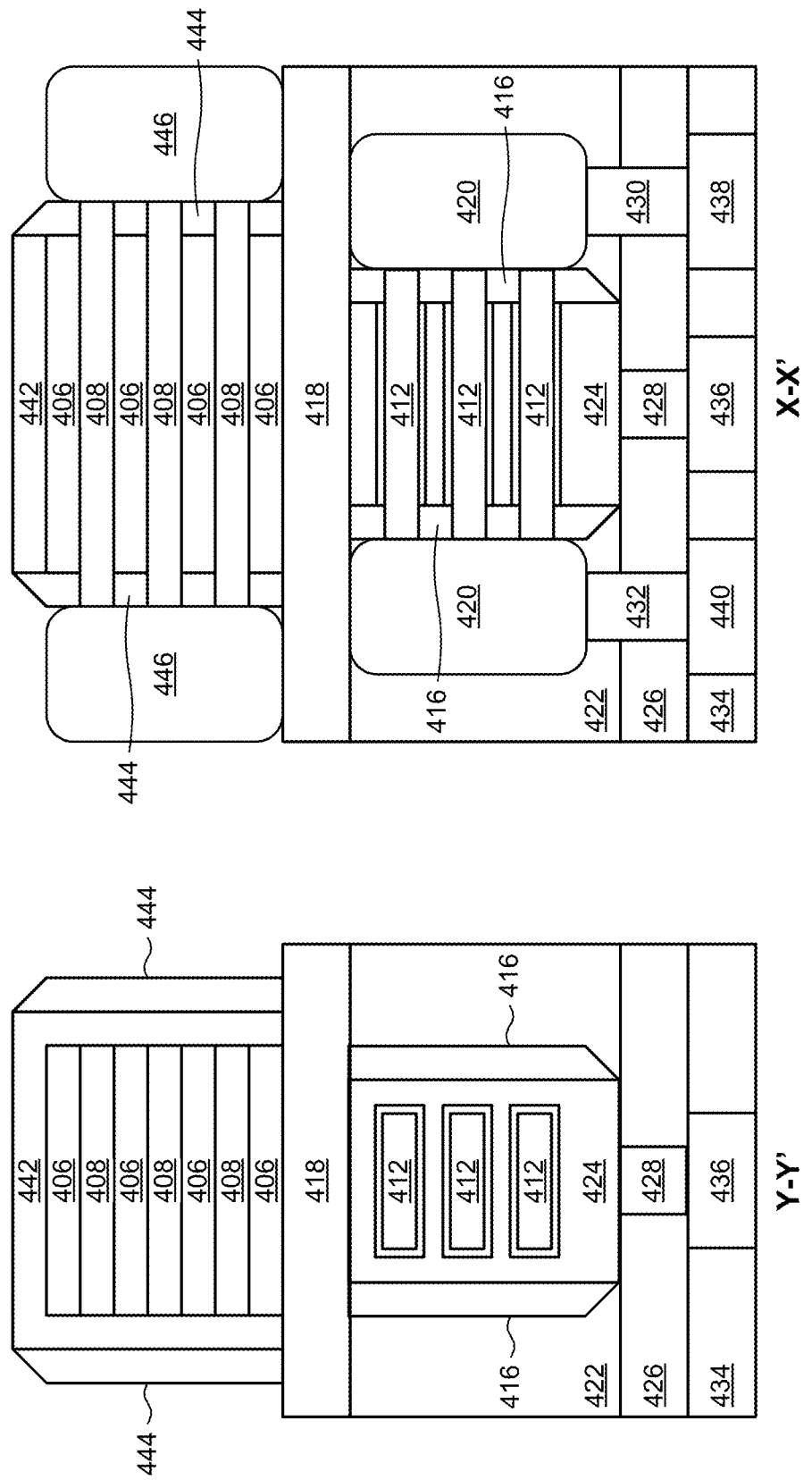

FIG. 5D shows the wafer 400 after recessing the SiGe layers 406, depositing SiN into the recesses, and etching back to form an inner spacer, and depositing source and drain epitaxial layers 446.

Figure 5E:
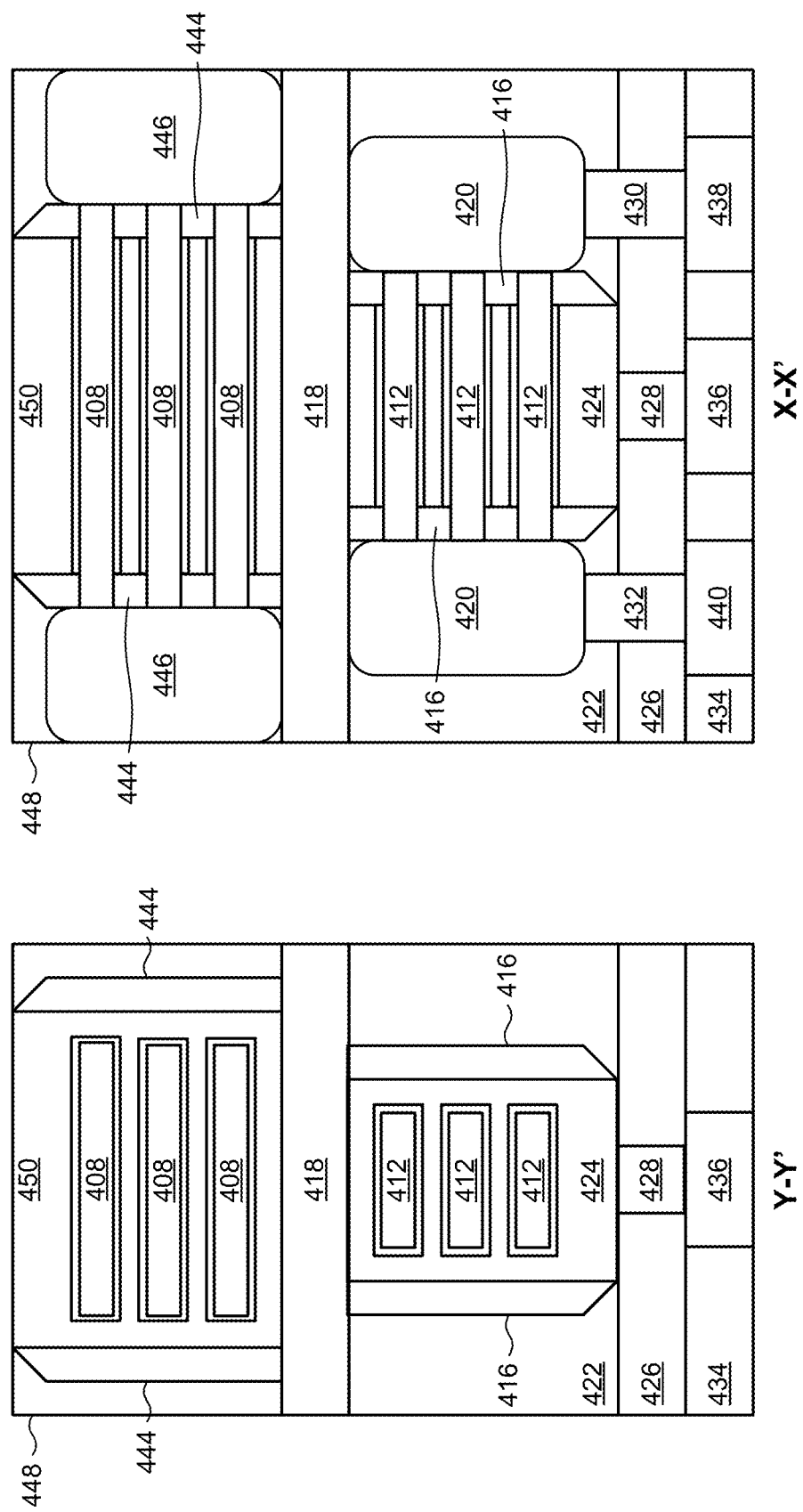

FIG. 5E shows the wafer 400 after depositing a third F-ILD oxide 448 and performing a chemical-mechanical polishing (CMP) step, then replacing the second dummy poly layer 442 with a second high-k and metal gate 450, and performing another CMP step.

Figure 5F:
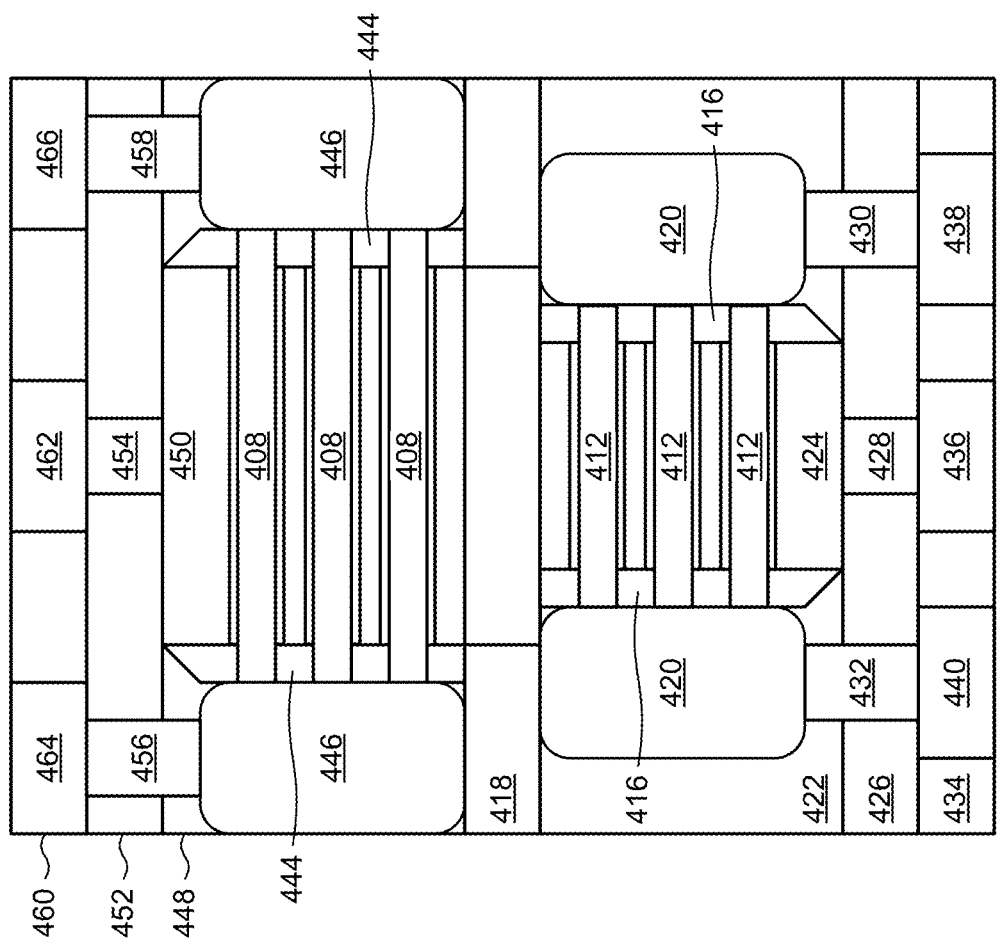
Figure 5F:
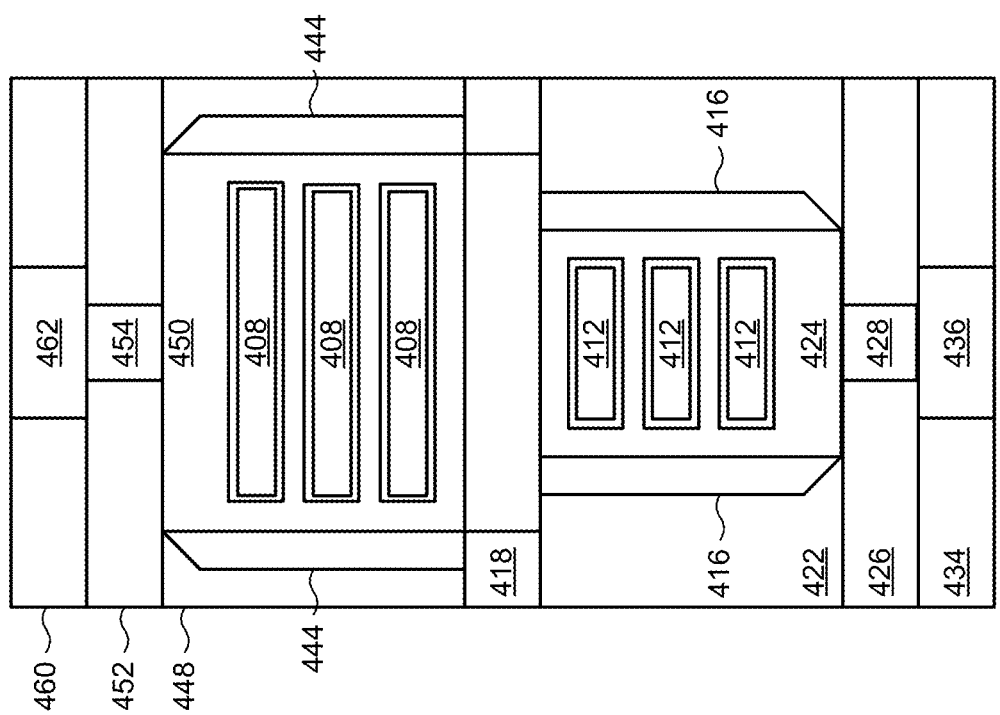

FIG. 5F shows the wafer 400 after depositing a fourth F-ILD oxide 452 and forming a second gate contact 454, a second source contact 456, and a second drain contact 458, then depositing a second field inter-metal-dielectric (F-IMD) oxide 460, and forming first metal layer structures such as the second gate metal contact 462, the second source metal contact 464, and the second drain metal contact 466.

The wafer 400 is then removed from the carrier wafer to complete the process. The resulting CFET device will have an nFET with parallel channels of width W1 and length L1, and a pFET with parallel channels of width W2 and length L2.

The process illustrated in FIGS. 4A-4F and FIGS. 5A-5F show a process that results in the CFET device such as CFET 300, e.g., having the nFET and pFET centered vertically and having the contacts for the nFET and the contacts for the pFET be on opposite sides of the device from each other, but it will be understood that the same principles of construction may be used to create a CFET device such as CFET 332, e.g., having the nFET and pFET offset from each other in the X and/or Y planes, and having at least some of the contacts for the nFET device be on the same side as the contacts for the pFET device, or vice versa.

Figure 6:
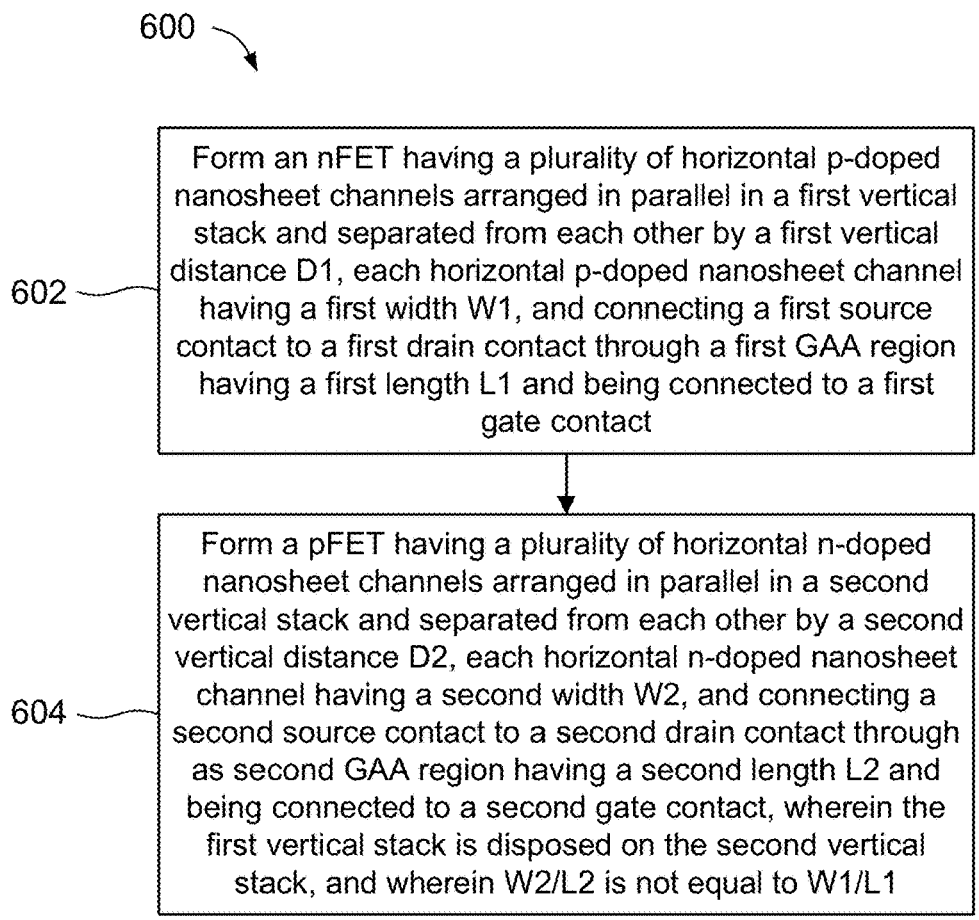
FIG. 6 is a flowchart of an example process for fabricating a CFET with balanced N and P drive currents, according to aspects of the disclosure.

FIG. 6 is a flowchart of an example process 600 for fabricating a CFET with balanced N and P drive currents, according to aspects of the disclosure.

As shown in FIG. 6, process 600 may include, at block 602, forming an nFET having a plurality of horizontal p-doped nanosheet channels arranged in parallel in a first vertical stack and separated from each other by a first vertical distance D1. Each horizontal p-doped nanosheet channel has a first width W1, and connects a first source contact to a first drain contact through a first GAA region having a first length L1. The first GAA region is connected to a first gate contact.

As further shown in FIG. 6, process 600 may include, at block 604, forming a pFET having a plurality of horizontal n-doped nanosheet channels arranged in parallel in a second vertical stack and separated from each other by a second vertical distance D2. Each horizontal n-doped nanosheet channel has a second width W2, and connects a second source contact to a second drain contact through as second GAA region having a second length L2. The second GAA region is connected to a second gate contact. The first vertical stack is disposed on the second vertical stack, and W2/L2 is not equal to W1/L1.

In some aspects, the first vertical stack is formed horizontally centered around a first vertical axis and the second vertical stack is formed horizontally centered around a second vertical axis different from the first vertical axis, or the first vertical stack and the second vertical stack are formed horizontally centered around a common shared vertical axis.

In some aspects, the first source contact, the first gate contact, and the first drain contact are formed on a first surface of the CFET structure and the second source contact, the second gate contact, and the second drain contact are formed on a second surface of the CFET structure opposite the first surface of the CFET structure.

In some aspects, the first source contact, the first gate contact, the first drain contact, and at least one of the second source contact, the second gate contact, and the second drain contact are formed on a first surface of the CFET structure.

In some aspects, at least one of the plurality of horizontal p-doped nanosheet channels and the plurality of horizontal n-doped nanosheet channels comprises Si, Ge, or SiGe.

In some aspects, the first GAA region, the second GAA region, or both, are formed comprising a high-k dielectric or metal gate.

In some aspects, each of the plurality of horizontal p-doped nanosheet channels are separated from the first GAA region by an insulating layer formed between the p-doped nanosheet channel and the first GAA region. In some aspects, each of the plurality of horizontal n-doped nanosheet channels are separated from the second GAA region by an insulating layer formed between the n-doped nanosheet channel and the second GAA region. In some aspects, the first GAA region is formed in direct contact with the second GAA region.

Process 600 may include additional implementations, such as any single implementation or any combination of implementations described below and/or in connection with one or more other processes described elsewhere herein. Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

It will be appreciated that the foregoing fabrication processes and related discussion are provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 7:
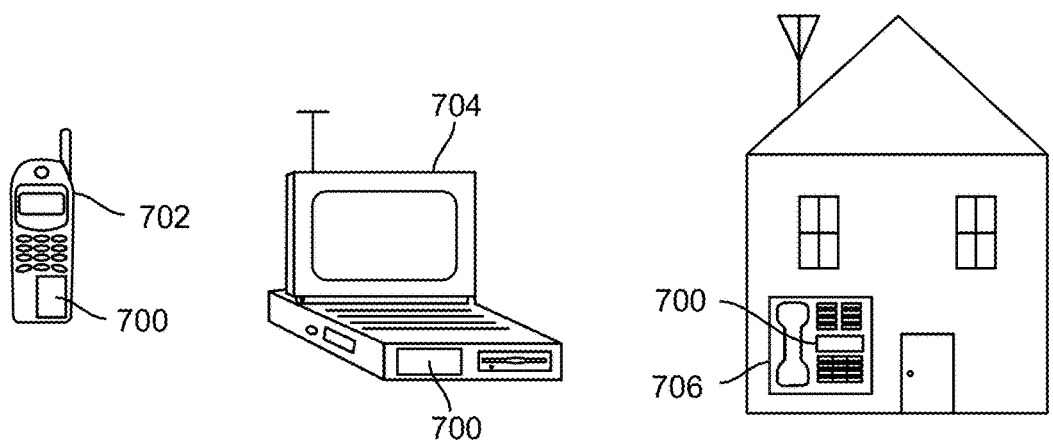
FIG. 7 illustrates various electronic devices which may utilize one or more aspects of the disclosure.

FIG. 7 illustrates various electronic devices 700 that may be integrated with any of the aforementioned devices in accordance with various aspects of the disclosure. For example, a mobile phone device 702, a laptop computer device 704, and a fixed location terminal device 706 may each be considered generally user equipment (UE) and may include one or more CFET structures (e.g., 300, 302) as described herein. The devices 702, 704, 706 illustrated in FIG. 7 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IOT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A complementary field effect transistor (CFET) structure, comprising: an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact, wherein the first vertical stack is disposed on the second vertical stack, and wherein W2/L2 is not equal to W1/L1.

Clause 2. The CFET structure of clause 1, wherein a magnitude of a saturation current of the nFET is approximately equal to a magnitude of a saturation current of the pFET.

Clause 3. The CFET structure of any of clauses 1 to 2, wherein a ratio of (W2/L2) to (W1/L1) is less than or equal to 4.4.

Clause 4. The CFET structure of any of clauses 1 to 3, wherein: the first vertical stack is horizontally centered around a first vertical axis and the second vertical stack is horizontally centered around a second vertical axis different from the first vertical axis; or the first vertical stack and the second vertical stack are horizontally centered around a common shared vertical axis.

Clause 5. The CFET structure of any of clauses 1 to 4, wherein the first source contact, the first gate contact, and the first drain contact are disposed on a first surface of the CFET structure and the second source contact, the second gate contact, and the second drain contact are disposed on a second surface of the CFET structure opposite the first surface of the CFET structure.

Clause 6. The CFET structure of any of clauses 1 to 4, wherein the first source contact, the first gate contact, the first drain contact, and at least one of the second source contact, the second gate contact, and the second drain contact are disposed on a first surface of the CFET structure.

Clause 7. The CFET structure of any of clauses 1 to 6, wherein at least one of the plurality of horizontal p-doped nanosheet channels and the plurality of horizontal n-doped nanosheet channels comprises Si, Ge, or SiGe.

Clause 8. The CFET structure of any of clauses 1 to 7, wherein each of the plurality of horizontal p-doped nanosheet channels are separated from the first GAA region by an insulating layer disposed between the plurality of horizontal p-doped nanosheet channels and the first GAA region.

Clause 9. The CFET structure of any of clauses 1 to 8, wherein each of the plurality of horizontal n-doped nanosheet channels are separated from the second GAA region by an insulating layer disposed between the plurality of horizontal n-doped nanosheet channels and the second GAA region.

Clause 10. The CFET structure of any of clauses 1 to 9, wherein the first GAA region is in direct contact with the second GAA region.

Clause 11. A method of fabricating a complementary field effect transistor (CFET) structure, the method comprising: forming an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and forming a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact, wherein the first vertical stack is disposed on the second vertical stack, and wherein W2/L2 is not equal to W1/L1.

Clause 12. The method of clause 11, wherein a magnitude of a saturation current of the nFET is approximately equal to a magnitude of a saturation current of the pFET.

Clause 13. The method of any of clauses 11 to 12, wherein a ratio of (W2/L2) to (W1/L1) is less than or equal to 4.4.

Clause 14. The method of any of clauses 11 to 13, wherein: the first vertical stack is formed horizontally centered around a first vertical axis and the second vertical stack is formed horizontally centered around a second vertical axis different from the first vertical axis; or the first vertical stack and the second vertical stack are formed horizontally centered around a common shared vertical axis.

Clause 15. The method of any of clauses 11 to 14, wherein the first source contact, the first gate contact, and the first drain contact are formed on a first surface of the CFET structure and the second source contact, the second gate contact, and the second drain contact are formed on a second surface of the CFET structure opposite the first surface of the CFET structure.

Clause 16. The method of any of clauses 11 to 14, wherein the first source contact, the first gate contact, the first drain contact, and at least one of the second source contact, the second gate contact, and the second drain contact are formed on a first surface of the CFET structure.

Clause 17. The method of any of clauses 11 to 16, wherein at least one of the plurality of horizontal p-doped nanosheet channels and the plurality of horizontal n-doped nanosheet channels comprises Si, Ge, or SiGe.

Clause 18. The method of any of clauses 11 to 17, wherein each of the plurality of horizontal p-doped nanosheet channels are separated from the first GAA region by an insulating layer formed between the plurality of horizontal p-doped nanosheet channels and the first GAA region.

Clause 19. The method of any of clauses 11 to 18, wherein each of the plurality of horizontal n-doped nanosheet channels are separated from the second GAA region by an insulating layer formed between the plurality of horizontal n-doped nanosheet channels and the second GAA region.

Clause 20. The method of any of clauses 11 to 19, wherein the first GAA region is formed in direct contact with the second GAA region.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A complementary field effect transistor (CFET) structure, comprising:
   an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and
   a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact,
   wherein the first vertical stack is disposed on the second vertical stack, and wherein W2/L2 is not equal to W1/L1, and
   wherein the first source contact, the first gate contact, and the first drain contact are disposed on a first surface of the CFET structure and the second source contact, the second gate contact, and the second drain contact are disposed on a second surface of the CFET structure opposite the first surface of the CFET structure.

2. The CFET structure of claim 1, wherein a magnitude of a saturation current of the nFET is equal to a magnitude of a saturation current of the pFET.

3. The CFET structure of claim 1, wherein:
   the first vertical stack is horizontally centered around a first vertical axis and the second vertical stack is horizontally centered around a second vertical axis different from the first vertical axis; or
   the first vertical stack and the second vertical stack are horizontally centered around a common shared vertical axis.

4. The CFET structure of claim 1, wherein one or more of the group of the plurality of horizontal p-doped nanosheet channels and the plurality of horizontal n-doped nanosheet channels comprises Si, Ge, or SiGe.

5. The CFET structure of claim 1, wherein each of the plurality of horizontal p-doped nanosheet channels are separated from the first GAA region by an insulating layer disposed between the plurality of horizontal p-doped nanosheet channels and the first GAA region.

6. The CFET structure of claim 1, wherein each of the plurality of horizontal n-doped nanosheet channels are separated from the second GAA region by an insulating layer disposed between the plurality of horizontal n-doped nanosheet channels and the second GAA region.

7. The CFET structure of claim 1, wherein the first GAA region is in direct contact with the second GAA region.

8. A complementary field effect transistor (CFET) structure, comprising:
- an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and
- a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact,
- wherein the first vertical stack is disposed on the second vertical stack, and wherein W2/L2 is not equal to W1/L1, and
- wherein a ratio of (W2/L2) to (W1/L1) is less than or equal to 4.4.

9. The CFET structure of claim 3, wherein the first source contact, the first gate contact, the first drain contact, the second source contact, the second gate contact, and the second drain contact are disposed on a first surface of the CFET structure.

10. A method of fabricating a complementary field effect transistor (CFET) structure, the method comprising:
- forming an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and
- forming a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact,
- wherein the first vertical stack is disposed on the second vertical stack, and wherein W2/L2 is not equal to W1/L1, and
- wherein the first source contact, the first gate contact, and the first drain contact are formed on a first surface of the CFET structure and the second source contact, the second gate contact, and the second drain contact are formed on a second surface of the CFET structure opposite the first surface of the CFET structure.

11. The method of claim 10, wherein a magnitude of a saturation current of the nFET is equal to a magnitude of a saturation current of the pFET.

12. The method of claim 11, wherein:
- the first vertical stack is formed horizontally centered around a first vertical axis and the second vertical stack is formed horizontally centered around a second vertical axis different from the first vertical axis; or
- the first vertical stack and the second vertical stack are formed horizontally centered around a common shared vertical axis.

13. The method of claim 10, wherein one or more of the group of the plurality of horizontal p-doped nanosheet channels and the plurality of horizontal n-doped nanosheet channels comprises Si, Ge, or SiGe.

14. The method of claim 10, wherein each of the plurality of horizontal p-doped nanosheet channels are separated from the first GAA region by an insulating layer formed between the plurality of horizontal p-doped nanosheet channels and the first GAA region.

15. The method of claim 10, wherein each of the plurality of horizontal n-doped nanosheet channels are separated from the second GAA region by an insulating layer formed between the plurality of horizontal n-doped nanosheet channels and the second GAA region.

16. The method of claim 10, wherein the first GAA region is formed in direct contact with the second GAA region.

17. A method of fabricating a complementary field effect transistor (CFET) structure, the method comprising;
- forming an n-channel field effect transistor (nFET) having a plurality of horizontal p-doped nanosheet channels arranged in parallel in a first vertical stack and separated from each other by a first vertical distance (D1), each horizontal p-doped nanosheet channel having a first width (W1), and connecting a first source contact to a first drain contact through a first gate-all-around (GAA) region having a first length (L1) and being connected to a first gate contact; and
- forming a p-channel field effect transistor (pFET) having a plurality of horizontal n-doped nanosheet channels arranged in parallel in a second vertical stack and separated from each other by a second vertical distance (D2), each horizontal n-doped nanosheet channel having a second width (W2), and connecting a second source contact to a second drain contact through a second GAA region having a second length (L2) and being connected to a second gate contact,
- wherein the first vertical stack is disposed on the second vertical stack, and wherein W2/L2 is not equal to W1/L1, and
- wherein a ratio of (W2/L2) to (W1/L1) is less than or equal to 4.4.

18. The method of claim 13, wherein the first source contact, the first gate contact, the first drain contact, and the second source contact, the second gate contact, and the second drain contact are formed on a first surface of the CFET structure.

* * * * *